(12) United States Patent
Soldavini et al.

(10) Patent No.: US 6,421,258 B1
(45) Date of Patent: Jul. 16, 2002

(54) CURRENT ZERO CROSSING DETECTING CIRCUIT

(75) Inventors: Francesco Chrappan Soldavini, S. Donato Milanese; Luca Fontanella, Veneza, both of (IT)

(73) Assignee: STMicroelectronics, s.r.l., Agrate Brianza MI (IT)

( * ) Notice: Subject to any disclaimer, the term of this patent is extended or adjusted under 35 U.S.C. 154(b) by 0 days.

(21) Appl. No.: 09/947,201

(22) Filed: Sep. 4, 2001

(30) Foreign Application Priority Data

Sep. 14, 2000 (IT) .................. MI20000A001999

(51) Int. Cl.[7] ............................................. H02H 7/122
(52) U.S. Cl. .................... 363/56.02; 363/132
(58) Field of Search .................. 363/56.01, 56.02, 363/58, 98, 132; 361/57

(56) References Cited

U.S. PATENT DOCUMENTS

| | | | | |
|---|---|---|---|---|
| 4,796,145 A | * | 1/1989 | Oshikiri | 361/57 |
| 5,559,467 A | * | 9/1996 | Smedley | 330/10 |
| 5,708,578 A | * | 1/1998 | Stoddard et al. | 363/98 |
| 5,764,024 A | * | 6/1998 | Wilson | 318/805 |
| 5,892,673 A | * | 4/1999 | Delgado et al. | 363/98 |
| 6,172,550 B1 | * | 1/2001 | Gold et al. | 327/366 |

* cited by examiner

*Primary Examiner*—Adolf Deneke Berhane
(74) *Attorney, Agent, or Firm*—Hogan & Hartson, LLP

(57) ABSTRACT

The present invention relates a current zero crossing detecting circuit including a PWM driving half bridge circuit, which generates an output signal (OUT) and a signal synchronous with the high impedance condition of said PWM driving half bridge circuit. Said inventive circuit has the characteristic of comprising detecting means (DFLIP, COMP) synchronous with said signal synchronous with the high impedance condition of said PWM driving half bridge circuit and said output signal (OUT), and said detecting means generating a direction signal (DIR_COR) showing the current direction flowing in said pulse width modulation circuit.

7 Claims, 2 Drawing Sheets

CURRENT ZERO CROSSING DETECTING CIRCUIT

DESCRIPTION

The present invention relates to a current zero crossing detecting circuit, particularly to a driving half bridge circuit of Pulse Width Modulation (PWM) type for a brushless motor.

A brushless motor is a synchronous motor the rotation of which is obtained by means of a switching of the currents in the windings synchronously with the rotor position. It is necessary, therefore, knowing exactly the rotor position so as to obtain the best precision for the motor working and this position is usually deduced by means of two approaches: 1) by means of Hall effect position sensors; 2) by means of a counter electromotive force signal (BEMF).

In this last embodiment the driving current curve must coincide with the curve of BEMF to obtain the maximum efficiency of driving.

In the driving of brushless motors, therefore, the current zero crossing in the motor windings has to be identified so as to realize a synchronization with the BEMF zero crossing.

Presently, in order to establish the current zero crossing in the PWM driving half bridge circuits a resistance, disposed in series to a single motor winding, connected with a specific comparator, so as to detect the voltage zero crossing, as shown in FIG. 1, is used.

The drawback of this embodiment resides in the use of an external component, in the specific case a resistance, for reading the voltage value.

In view of the state of the art described, it is an object of the present invention detecting the current zero crossing information without the necessity of the presence of an external component.

According to the present invention, such object is achieved by a current zero crossing detecting circuit including a PWM driving half bridge circuit, which generates an output signal and a signal synchronous with the high impedance condition of said PWM driving half bridge circuit, characterized by comprising detecting means synchronous with said signal synchronous with the high impedance condition of said PWM driving half bridge circuit and said output signal, and said detecting means generating a direction signal showing the current direction flowing in said pulse width modulation circuit.

Thanks to the present invention it is possible making a circuit adapted to detect the current zero crossing without the help of any devices external to the PWM driving circuit.

Moreover, thanks to the present invention it is also possible obtaining a detecting circuit of easier realization.

The features and the advantages of the present invention will be made evident by the following detailed description of an embodiment, thereof, which is illustrated as not limiting example in the annexed drawings, wherein.

Figure 1:
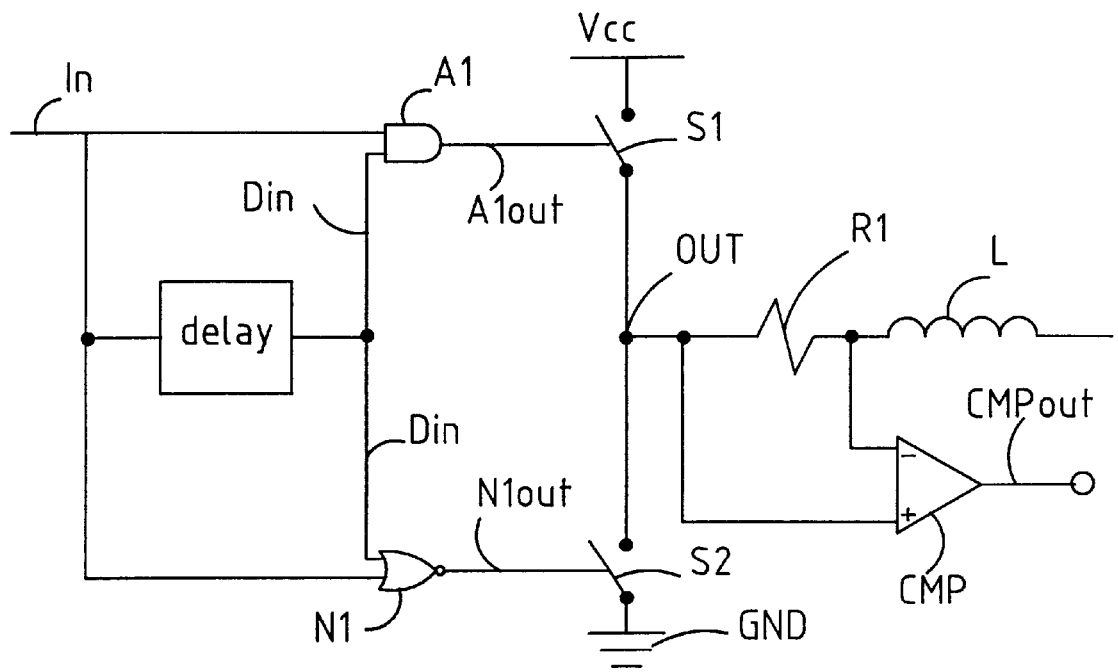
FIG. 1 shows a current zero crossing detecting circuit according to the prior art.

In FIG. 1 a current zero crossing detecting circuit according to the prior art is shown, wherein it is to be noted a first switch S1, controlled by a logic gate A1 of AND type and connected to a voltage supply Vcc, and a second switch S2, controlled by a logic gate N1 of NOR type, connected to the ground GND.

The switches S1 and S2 can be made for example by DMOS power transistors or by whichever switching device.

Said switches have a point in common, called OUT, that represents the out terminal of the circuit in exam.

It is to be noted also the presence of a shifting or delaying circuit, called delay, that has in input a signal In and outputs said signal Din.

The delay circuit has the characteristic of shifting in the time by a fixed and a priori known quantity an incoming signal and therefore the signal Din is shifted (or delayed) in the time of a fixed quantity with respect to the signal In.

In fact the structure of the circuit, shown in Figure, foresees that the drivers of said switches S1 and S2, that is the driving circuits of said switches S1 and S2, have in input, for the logic gate A1, a first signal In and a second signal Din so as to provide an output signal A1 out adapted to control said switch S1 and for said logic gate N1, they have in input said signal In and said signal Din so as to provide an output signal N1 out adapted to control said switch S2.

Therefore the logic gate A1 and N1 are controlled by the signal In and by the signal Din, this latter shifted (or delayed) with respect to said signal In.

The displacement of the switches S1 and S2 with the respective logic gates and the delay circuit provide what is commonly known as PWM type driving half bridge.

Such a nature of circuits provides, in fact, a suitable shifting or delaying circuit, so as to avoid the cross conduction phenomenon, that is the simultaneous turning on of the high-side and low-side power stage with the consequent flowing of high values of current during the output switching.

It is to be noted also that in the output point OUT of the PWM circuit a resistance R1 is connected, placed in series with an inductor L.

The inductor L is the load of the driving half bridge circuit of PWM type and it can represent, for example, a single winding of a brushless motor.

Said resistance R1 is also placed in parallel with a comparator CMP, adapted to identify the voltage zero crossing at the terminals of said resistance R1.

Said comparator CMP provides an output signal CMPout showing the direction of the flowing current in said resistance R1.

Such a nature circuit allows to identify the current zero crossing thanks to the presence of said resistance R1, but it has the remarkable disadvantage of adding an external device (the resistance R1) to read the direction of the current.

Figure 2:
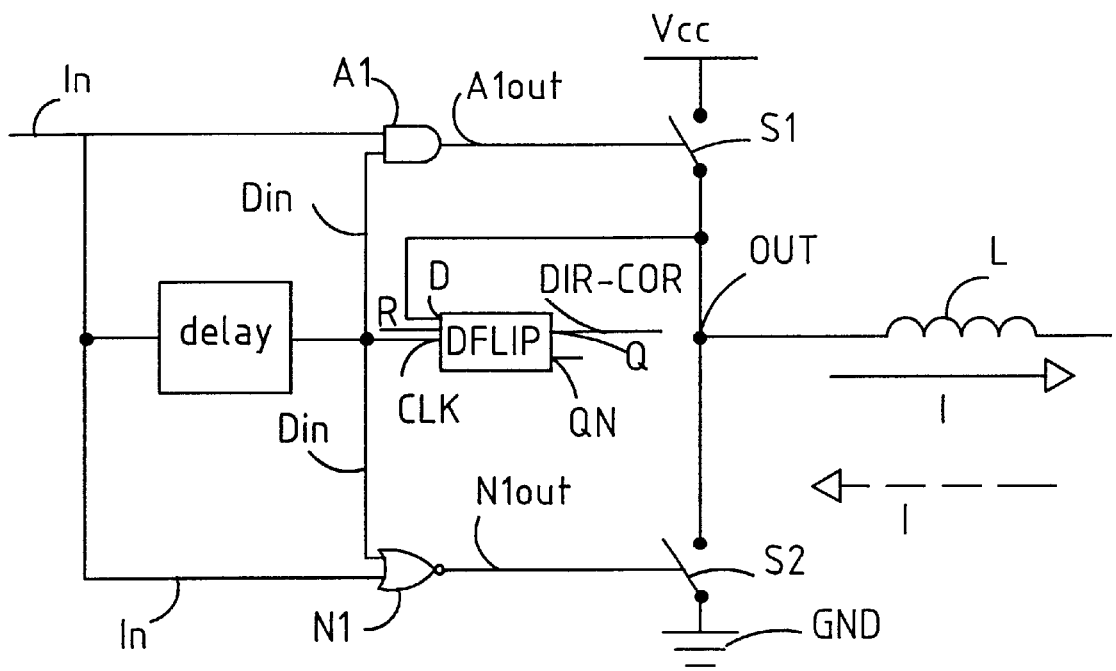
FIG. 2 shows a first embodiment of a current zero crossing detecting circuit according to the present invention.

In contrast, in FIG. 2 a circuit according to the present invention is shown, wherein, further the circuit elements described in FIG. 1, it is to be noted the presence of a D type flip flop, called DFLIP, having a first input pin, called CLK, connected to said signal Din, a second input pin, called D, connected to the point OUT of the PWM driving circuit, a third input pin, called R, adapted to reset the instantaneous value stored in said DFLIP, a first output pin, called Q, adapted to provide a direction signal showing the current direction, called direction signal DIR_COR, a second output pin, called QN, adapted to provide the inverted signal being to the pin Q.

The proposed solution makes use of a characteristic of the driving half bridge circuits of PWM type to deduce the information of the current zero crossing.

In fact the delay circuit, or whichever type circuit adapted to avoid cross conduction phenomena, whichever is its implementation, for example by means of a fixed delay between the turning off of the high-side switch S1 and the turning on of the complementary switch S2, or by means of a couple of comparators that, by monitoring the voltage on the gate electrodes of the two DMOS power transistors, that is of the switches S1 and S2, allow the turning on of the complementary stage once detected the turning off of the controlled stage, provides always a signal synchronous with the condition of high impedance that derives during the commutation.

In high impedance condition the voltage value of the point OUT will be forced in function of the current direction flowing in the circuit itself or toward the supply voltage value Vcc or toward the ground value GND.

The Applicant has noted that, by measuring the voltage value of the point OUT by suitable detecting means synchronized with the high impedance signal, it is possible detecting the current direction and therefore detecting the current zero crossing.

Figure 3:
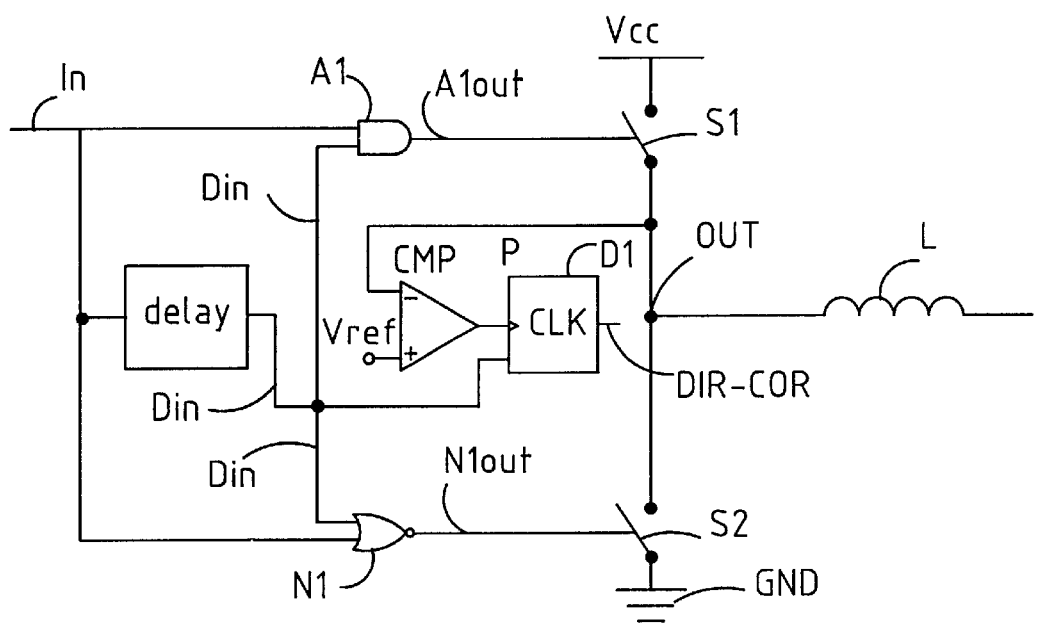
FIG. 3 shows a second embodiment of the current zero crossing detecting circuit according to the present invention.

A first embodiment in FIG. 2 is shown, wherein the detecting means is, for example, the DFLIP or the embodiment shown in FIG. 3, wherein the detecting means is, for example, a comparator COMP.

In FIG. 3 it is to be noted that the comparator COMP has the non inverting input connected to a reference voltage Vref, for example Vref=Vcc/2, the inventing input connected to the output OUT of the PWM driving half bridge and the output connected to a latch device D1, synchronized by means of the signal Din, adapted to provide a direction signal DIR_COR showing the current direction.

Both the embodiments have the characteristic of detecting the voltage at the point OUT, voltage approaching the supply voltage Vcc or approaching the ground voltage, and providing the signal showing the current direction.

Figure 4:
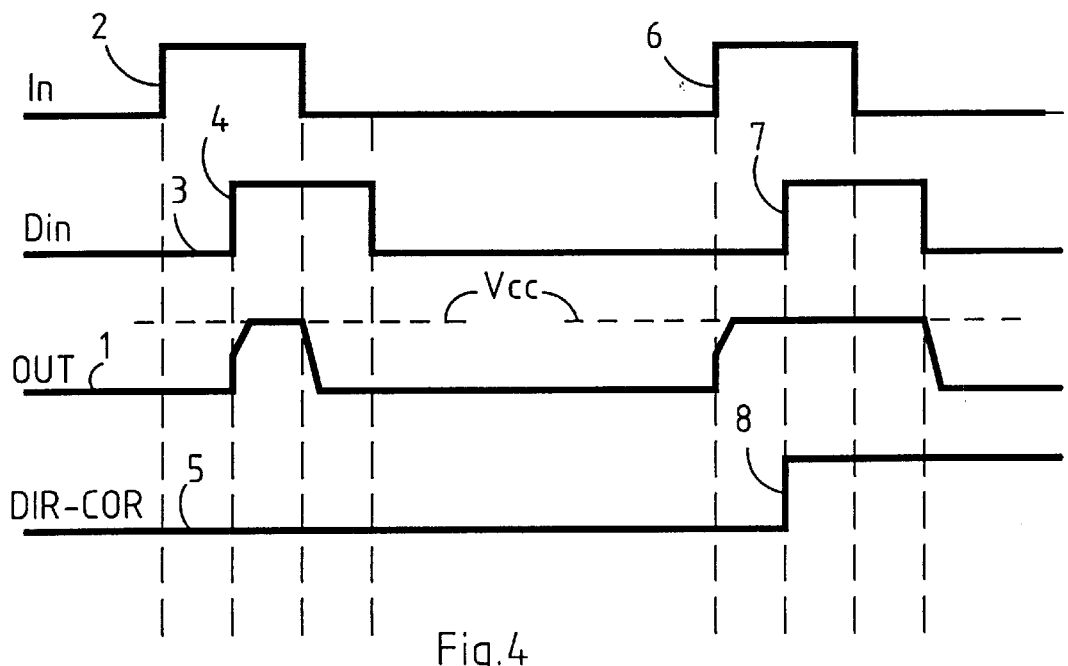
FIG. 4 shows the trend of some signals in relationship with the circuit of FIG. 2.

In FIG. 4 the trend of the signals In, Din, OUT and DIR_COR according two successive switching of the output stage between which there is a change of the current direction, is shown.

Particularly in such a Figure it is to be noted that the signal In is the input signal of the logic gates A1 and N1 and to the delay circuit, the signal Din is the shifted signal with respect to the signal In, the signal OUT is the voltage trend at the output terminal of the PWM circuit connected to the load L, and finally the direction signal DIR_COR is the status of the signal at the output pin of DFLIP.

It is to be noted that the DFLIP is synchronized during the rising edge of the signal Din.

Referring to the circuit of FIG. 2, but similar considerations state also for the circuit of FIG. 3, and taking into account what is shown in FIG. 4 and assuming that the voltage of the point OUT is low, segment 1, the switch S2 has to be necessarily turned off, and assuming that the load L requires current with a direction equal to that shown in FIG. 2 by continuous line, on the rising edge 2 of the signal In the gate N1 opens S2, whilst S1 is still open.

This happens because the input of the gate A1, that drives the S1, has still at its input pin a low value 3 of the signal incoming from the delay circuit, that is Din.

The output OUT doesn't switch because the current I flows totally in the re-circulating diode of the low-side DMOS transistor, that is the driving circuit is in a condition known as three-state, wherein the output OUT is going below the ground value.

The output OUT switches when the rising edge 4 of the signal Din incomes, approaching to the supply voltage Vcc, because the switch S1 has been turned off.

The signal OUT is connected to the DFLIP that consequentially stores on its output pin a low logic level 5, as shown by the direction signal DIR_COR.

By assuming that for every variations the load L provides a current, that is the direction of the current I is changed and it has a direction as that shown in FIG. 2 in a dash line, on the second rising edge 6 of the signal In, the switch S2 will switch from an off condition to an on condition, and the output OUT switches immediately to the supply voltage value Vcc.

The output OUT switches immediately because the current flows in the re-circulating diode of the high-side DMOS, that is the output switches due to the current I (of the load) flows into the diode of S1, that is also in this situation the driving circuit is in a condition known as three-state, wherein the output OUT is over the supply voltage value Vcc.

The switch S1 is turned off when the rising edge 7 of the signal Din incomes and the output is still at a high value until the signal Din is off.

The output OUT is connected to the DFLIP and therefore it stores at its output pin a high logic level, as shown by the direction signal DIR_COR, rising edge 8.

The information of the direction inversion of the current direction I is therefore available in a synchronous way with the commutation of the PWM driving stage.

What is claimed is:

1. Current zero crossing detecting circuit including a PWM driving half bridge circuit, which generates an output signal (OUT) and a signal synchronous with the high impedance condition of said PWM driving half bridge circuit, characterized by comprising detecting means (DFLIP, COMP) synchronous with said signal synchronous with the high impedance condition of said PWM driving half bridge circuit and said output signal (OUT), and said detecting means generating a direction signal (DIR_COR) showing the current direction flowing in said pulse width modulation circuit.

2. Detecting circuit according to the claim 1, characterized in that said detecting means is D type flip flop logic gate (DFLIP).

3. Detecting circuit according to the claim 1, characterized in that said logic gate (DFLIP) has in input said output signal (OUT) of said PWM driving half bridge circuit and it has in input a shifting signal (Din) and it provides said direction signal (DIR_COR).

4. Detecting circuit according to the claim 3, characterized in that said shifting signal (Din) by a delaying circuit (delay) is provided.

5. Detecting circuit according to the claim 1, characterized in that said PWM driving half bridge circuit and said delaying circuit (delay) have in input said input signal (In).

6. Detecting circuit according to the claim 1, characterized in that said detecting means is a comparator (COMP).

7. Detecting circuit according to the claim 6, characterized in that said comparator (COMP) has in input at the non inverting terminal a reference voltage (Vref), has in input at the inverting terminal said output signal (OUT) and its output is connected with a latch device (D1) adapted to provide said direction signal (DIR_COR).

* * * * *

UNITED STATES PATENT AND TRADEMARK OFFICE
CERTIFICATE OF CORRECTION

PATENT NO.    : 6,421,258 B1
DATED         : July 16, 2002
INVENTOR(S)   : Francesco Chrappan Soldavini and Luca Fontanella It is certified that error appears in the above-identified patent and that said Letters Patent is hereby corrected as shown below:

<u>Column 4,</u>
Line 55, delete "claim 1" and substitute therefor -- claim 4 --.

Signed and Sealed this

Fifteenth Day of October, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,421,258 B1
DATED : July 16, 2002
INVENTOR(S) : Francesco Chrappan Soldavini and Luca Fontanella It is certified that error appears in the above-identified patent and that said Letters Patent is hereby corrected as shown below:

Drawings,
Sheet 2 or 2, replace FIG. 4 as shown below:

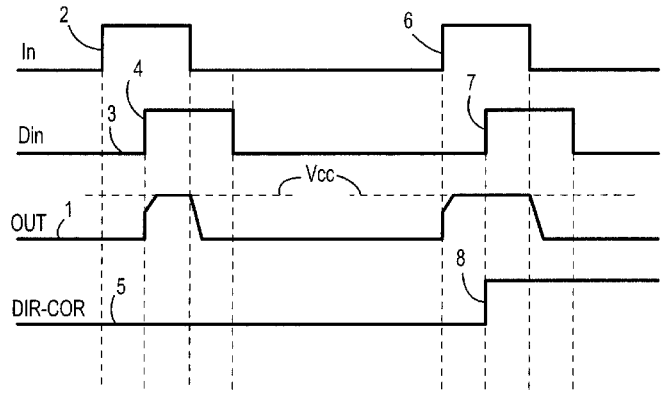

Fig.4

Column 3,
Line 56, delete "off" and substitute therefor -- on --;

Column 4,
Line 3, delete "off" and substitute therefor -- on --;
Line 12, delete "off condition to an on" and substitute therefor -- on condition to an off --; and
Line 22, delete "off" and substitute therefor -- on --.

Signed and Sealed this

Twenty-eighth Day of October, 2003

JAMES E. ROGAN
*Director of the United States Patent and Trademark Office*